US011037429B2

United States Patent
Baranowsky et al.

(10) Patent No.: US 11,037,429 B2
(45) Date of Patent: Jun. 15, 2021

(54) EMBEDDED ACTIVE ENVIRONMENTAL CONTAMINANT MONITOR

(71) Applicant: Oracle International Corporation, Redwood Shores, CA (US)

(72) Inventors: Menachem Joseph Baranowsky, Ontario (CA); Abraham Feler, Ontario (CA)

(73) Assignee: Oracle International Corporation, Redwood Shores (CA)

( * ) Notice: Subject to any disclaimer, the term of this patent is extended or adjusted under 35 U.S.C. 154(b) by 89 days.

(21) Appl. No.: 16/407,676

(22) Filed: May 9, 2019

(65) Prior Publication Data

US 2020/0357261 A1 Nov. 12, 2020

(51) Int. Cl.
*G08B 21/18* (2006.01)
*G01N 27/04* (2006.01)
*G01N 27/12* (2006.01)

(52) U.S. Cl.
CPC ......... *G08B 21/185* (2013.01); *G01N 27/045* (2013.01); *G01N 27/122* (2013.01)

(58) Field of Classification Search
CPC ... G08B 21/185; G01N 27/122; G01N 27/045
See application file for complete search history.

(56) References Cited

U.S. PATENT DOCUMENTS

| | | | | |
|---|---|---|---|---|
| 8,339,760 B2* | 12/2012 | Rabu | .................. | H01R 13/6683 |
| | | | | 361/120 |
| 2003/0222662 A1* | 12/2003 | Geisel | .................. | G01N 27/048 |
| | | | | 324/664 |
| 2005/0269213 A1 | 12/2005 | Steimle et al. | | |
| 2007/0229095 A1 | 10/2007 | Ramgopal et al. | | |
| 2018/0145002 A1* | 5/2018 | Munder | .................. | H01L 22/34 |
| 2018/0284011 A1 | 10/2018 | Farkas et al. | | |
| 2019/0004109 A1* | 1/2019 | Xu | ..................... | G01R 31/2812 |

FOREIGN PATENT DOCUMENTS

| | | |
|---|---|---|
| FR | 2932569 A1 | 12/2009 |
| JP | 2017-009360 A | 1/2017 |
| WO | 2017/210310 A1 | 12/2017 |

* cited by examiner

*Primary Examiner* — Akm Zakaria
(74) *Attorney, Agent, or Firm* — Invoke

(57) ABSTRACT

Techniques for environmental contaminant monitoring are disclosed. In some embodiments, a contaminant detection system electronically instigates a test circuit that shares an environment with another circuit to induce an electrical anomaly in the test circuit when environmental contamination is present. While electronically instigating the first circuit, the contaminant detection system monitors for an electrical anomaly indicative of the environmental contamination. Responsive to detecting an electrical anomaly in the test circuit that is indicative of environmental contamination, the contaminant detection system generates an alert that indicates that the second circuit has likely been exposed to the environmental contamination. The contaminant detection system may provide early warning of potentially caustic environments before creep corrosion or similar phenomena manifest in expensive hardware resources. Thus, hardware outages may be mitigated or avoided.

20 Claims, 8 Drawing Sheets

SUMMARY INFORMATION

NAVIGATION — 702

- SYSTEM INFO
  - SUMMARY
  - PROCESSORS
  - MEMORY
  - POWER
  - COOLING
  - STORAGE
  - NETWORKING
  - CONTAMINANTS
  - PCI DEVICES
  - FIRMWARE
- OPEN PROBLEMS (1)
- SYSTEM LOG
- REMOTE CTRL
- HOST MGMT
- SYSTEM MGMT
- POWER MGMT
- ILOM ADMIN

GENERAL INFORMATION — 704

| | |
|---|---|
| SYSTEM TYPE | RACK MOUNT |
| MODEL | SYSTEM13 |
| QPART ID | Q10542 |
| PART NUMBER | X4-PPN |
| SERIAL NUMBER | X4-PSN |
| COMPONENT MODEL | X4-4 |
| COMPONENT PART NUMBER | X4-PPN |
| COMPONENT SERIAL NUMBER | SYSTEM13 |
| SYSTEM IDENTIFIER | - |
| SYSTEM FIRMWARE VERSION | X86_3.2.2.0 |
| PRIMARY OPERATING SYSTEM | NOT AVAILABLE |
| HOST PRIMARY MAC ADDRESS | |
| ILOM ADDRESS | |
| ILOM MAC ADDRESS | |

ACTIONS — 706

| | | |
|---|---|---|
| POWER STATE | ⊙ ON | TURN OFF |
| LOCATOR INDICTOR | ⊙ OFF | TURN ON |
| ORACLE SYSTEM ASSISTANT VERSION: NOT AVAILABLE | | LAUNCH |
| SYSTEM FIRMWARE UPDATE | | UPDATE |
| REMOTE CONSOLE | | LAUNCH |

STATUS — 708

OVERALL STATUS: ⊗ SERVICE REQUIRED  TOTAL PROBLEM COUNT: 1

| SUBSYSTEM | STATUS | DETAILS | | |
|---|---|---|---|---|
| PROCESSORS | ⊙ OK | PROCESSOR ARCHITECTURE: | X86 64-BIT | |
| | | PROCESSOR SUMMARY: | FOUR INTEL XEON PROCESSOR E7 V12 SERIES | |
| MEMORY | ⊙ OK | INSTALLED RAM SIZE: | 256GB | |
| POWER | ⊙ OK | PERMITTED POWER CONSUMPTION: | 1607 WATTS | |
| | | ACTUAL POWER CONSUMPTION: | 403 WATTS | |
| COOLING | ⊙ OK | INLET AIR TEMPERATURE: | 23 °C | |
| | | EXHAUST AIR TEMPERATURE: | 23 °C | |
| STORAGE | △ NOT AVAILABLE | INSTEAD DISK SIZE: | NOT AVAILABLE | |
| | | DISK CONTROLLERS: | NOT AVAILABLE | |
| NETWORKING | ⊙ OK | | | |
| CONTAMINANT MONITORS | ⊗ SERVICE REQUIRED | CONTAMINATION DETECTED | | |

INVENTORY

| | |
|---|---|
| PROCESSORS: | 4/4 (INSTALLED/MAXIMUM) |
| DIMMS: | 32/96 (INSTALLED/MAXIMUM) |
| PSUS: | 2/2 (INSTALLED/MAXIMUM) |
| CHASSIS FANS: | 6/6 (INSTALLED/MAXIMUM) |
| PSU FANS: | NOT SUPPORTED |
| INTERNAL DISKS: | 6/6 (INSTALLED/MAXIMUM) |
| ETHERNET NICS: | 4 (INSTALLED) |
| TEST COUPONS: | 1 (INSTALLED) |

FIG. 7

EMBEDDED ACTIVE ENVIRONMENTAL CONTAMINANT MONITOR

TECHNICAL FIELD

The present disclosure generally relates to monitoring environments for contaminants. In particular, the present disclosure relates to systems and methods for predicting and diagnosing damage to electrical components caused by environmental contamination.

BACKGROUND

Environmental contamination may cause significant and irreversible damage to hardware resources in computing environments. Various substances, such as hydrogen sulfide and other gaseous compounds, may lead to creep corrosion or similar phenomena. If the environmental contamination is left unaddressed, expensive computing hardware may need to be replaced. In large-scale environments, such as cloud computing environments and datacenters, contamination may concurrently affect and require the replacement of several hardware components.

Environmental contamination may be difficult to diagnose when hardware resources fail. For instance, creep corrosion may take weeks or months to be detectable visibly and often requires magnification to observe. Further, when a filament or dendrite forms an electrical bridge across printed circuit board traces to component leads, the typical result is a short circuit that destroys the contaminant nearly instantaneously, leaving scant evidence of the root cause of the failure. As a result, an examination of affected hardware components often results in a No Trouble Found (NTF) finding. Thus, system administrators may have difficulty understanding why a hardware resource has failed. Without a proper understanding of the root cause of the hardware failure, the source of environmental contamination may be left unaddressed, leading to continuous replacement of expensive hardware.

In addition to replacement costs, continuous hardware failures may also cause repeated application outages without warning. For example, failure of a server's hardware may temporarily cutoff a client's access to a network application until the server is replaced or migrated. As a result, the quality of service for network or other computing applications may be negatively impacted. In mission critical applications and cloud services, such performance degradation may lead to breach of contract, dissatisfied customers, and loss of revenue.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

The embodiments are illustrated by way of example and not by way of limitation in the figures of the accompanying drawings. It should be noted that references to "an" or "one" embodiment in this disclosure are not necessarily to the same embodiment, and they mean at least one. In the drawings:

FIG. 7 illustrates an example graphical user interface (GUI) for viewing and managing hardware resources in accordance with some embodiments.

DETAILED DESCRIPTION

Figure 1:
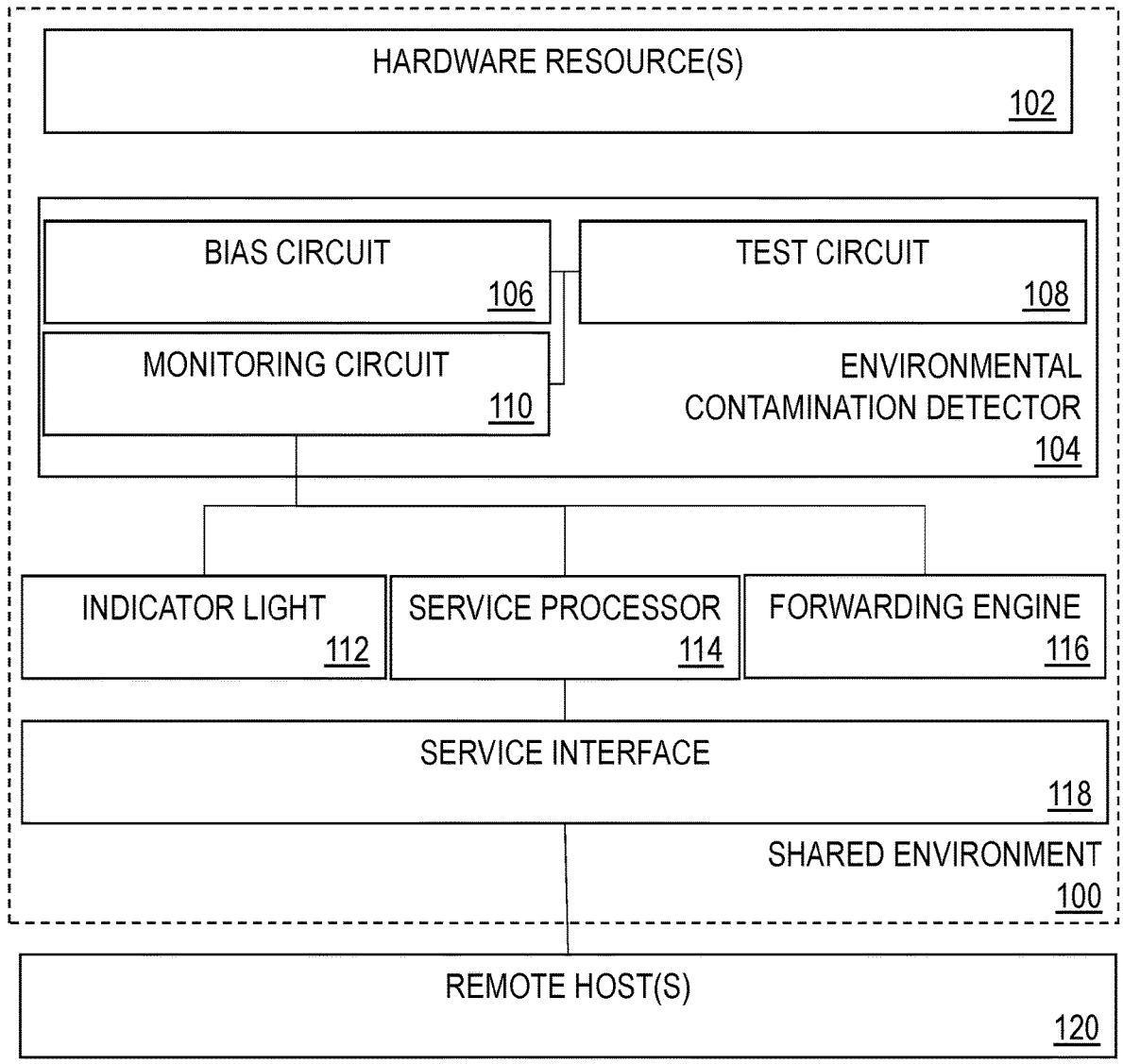
FIG. 1 illustrates an example system with an environmental contamination detector in accordance with some embodiments.

In the following description, for the purposes of explanation, numerous specific details are set forth in order to provide a thorough understanding. One or more embodiments may be practiced without these specific details. Features described in one embodiment may be combined with features described in a different embodiment. In some examples, well-known structures and devices are described with reference to a block diagram form in order to avoid unnecessarily obscuring the present invention.

1. GENERAL OVERVIEW
2. ARCHITECTURAL OVERVIEW
3. PREDICTIVE ALERTING CIRCUITRY AND METHODS
4. TEST CIRCUIT CONFIGURATIONS AND ANALYTICS
5. REMOTE TELEMETRY INTERFACES AND METHODS
6. COMPUTING HARDWARE ARCHITECTURE
7. MISCELLANEOUS; EXTENSIONS

1. General Overview

Systems and methods described herein provide for active environmental contaminant monitoring. In some embodiments, the systems and methods provide predictive notification of hardware contamination. Predictive alerts may be generated by a monitoring mechanism that is exposed to a shared environment with other hardware resources. The monitoring mechanism may be configured to detect electrical anomalies indicative of early signs of environmental contamination. If environmental contamination is detected, then the monitoring mechanism may output a predictive alert to notify a user that the other hardware resources in the shared environment were also likely exposed to the same contaminants. The predictive alerts allow for appropriate action to be taken before the environmental contamination causes hardware outages and/or requires the hardware resources to be replaced.

In some embodiments, the monitoring mechanism is configured to detect electrical anomalies in a test circuit. The test circuit may be designed and electronically instigated in a manner that induces electrical anomalies in the test circuit in the presence of environmental contamination. This approach allows electrical anomalies to manifest in the test circuit before other hardware resources exposed to the same environment are significantly impacted. For example, a different bias voltage may be applied to the test circuit than other hardware resources in the shared environment. A different bias voltage, such as a higher bias voltage, may help induce creep corrosion and similar phenomena in the presence of a caustic environment. In certain circumstances, the system may provide weeks or months of advance notice before similar levels of creep corrosion manifest in critical hardware components.

In some embodiments, systems and methods described herein facilitate root cause analysis and identification of the source of contaminants within an environment. Electrical instigation of the test circuit may be halted responsive to detecting an electrical anomaly indicative of environmental contamination. This approach helps prevent short circuits from destroying contaminants and preserves evidence of the root cause of the detected electrical anomalies. Additionally or alternatively, the test circuit may be detachable or otherwise easily removable to allow for further analysis of chemical makeup of the contaminants. Removal may be achieved without affecting normal operation of other hardware resources in the shared environment to provide non-intrusive contaminant monitoring and detection.

In some embodiments, systems and methods described herein provide for remote telemetry and management capabilities. If environmental contamination is detected, a service processor may update status information associated with the affected hardware resources. The service processor may send alerts and/or provide interfaces accessible to remote hosts to notify users in other locations of environmental contamination. The service processor may provide remote management capabilities to migrate, shutdown, restart, and/or otherwise configure computing resources exposed to potentially harmful contaminants. The techniques thus allow for timely action to be taken to mitigate the risk of service outages.

One or more embodiments described in this Specification and/or recited in the claims may not be included in this General Overview section.

2. Architectural Overview

FIG. 1 illustrates an example system with an environmental contamination detector in accordance with some embodiments. In various embodiments, the system depicted in FIG. 1 may include more or fewer components than those that are illustrated. Operations described with respect to one component may instead be performed by another component. Additionally or alternatively, operations described with respect to one component may be split across multiple components. Additionally or alternatively, operations of multiple components may be combined into a single component.

Referring to FIG. 1, shared environment 100 comprises hardware resource(s) 102, environmental contamination detector 104, indicator light 112, service processor 114, and forwarding engine 116. In some embodiments, shared environment 100 corresponds to an enclosed area, such as a hardware rack, cabinet, room, or building. However, shared environment 100 may also correspond to unenclosed spaces in other implementations. The components within shared environment 100, including hardware resource(s) 102 and environmental contamination detector 104, may be subject to the same contaminants due to physical proximity. For example, hardware components within the same hardware rack or server room may be subject to similar levels of water vapor, gases containing sulfur, and/or other potentially harmful compounds. Environmental contamination detector 104 may be configured to monitor for contamination and generate predictive alerts when detected to prevent and mitigate damage to hardware resource(s) 102.

Hardware resource(s) 102 represent one or more computing and/or other electronic hardware components located within shared environment 100. A hardware resource may include, but is not limited to, a motherboard, a central processing unit (CPU), a microprocessor, a storage drive or device, a computer, a tablet, a laptop, a desktop, a netbook, a server, a web server, a network policy server, a proxy server, a generic machine, a function-specific hardware device, a hardware router, a hardware switch, a hardware firewall, a hardware firewall, a hardware network address translator (NAT), a hardware load balancer, a mainframe, a television, a content receiver, a set-top box, a printer, a mobile handset, a smartphone, a personal digital assistant (PDA), a wireless receiver and/or transmitter, a base station, a communication management device, a router, a switch, a controller, and/or an access point.

Environmental contamination detector 104 is also located in shared environment 100 to monitor for potential exposure of hardware resource(s) 102 to contaminants. In some embodiments, environmental contamination detector 104 may be embedded within one of hardware resource(s) 102. For example, environmental contamination detector 104 may be part of the same printed circuit board or plugged into the same card as another hardware resource. In other embodiments, environmental contamination detector 104 may be a separate module of an overall system where some resources are shared. For example, environmental contamination detector 104 may be a separate rack module mounted to the same hardware rack as hardware resource(s) 102. One or more system resources, such as power supplies, communication channels, and/or cooling sub-systems, may be shared by the rack-mounted modules. In other embodiments, environmental contamination module may be a separate and independently operated device that is in physical proximity to hardware resource(s) 102 without sharing any system resources.

In some embodiments, environmental contamination detector 104 is positioned within shared environment 100 in an area that is subject to airflow. For example, environmental contamination detector 104 may be positioned near a power supply or a fan where airflows are pulled and/or exhausted. Such positioning increases the likelihood that environmental contamination detector 104 will be in the path of environmental contaminants, which allows for early detection and warnings.

Environmental contamination detector 104 generally comprises bias circuit 106, test circuit 108, and monitoring circuit 110. Bias circuit 106 is configured to electronically instigate test circuit 108 in a manner that induces anomalies in the presence of contaminants. Monitoring circuit 110 detects anomalies indicative of contamination and outputs an alert signal if detected. Although depicted as distinct circuits, in some embodiments, two or more of bias circuit 106, test circuit 108, and monitoring circuit 110 may be sub-circuits that are part of the same overall circuit. For example, the sub-circuits may be connected and integrated into the same printed circuit board. Additionally or alternatively, environmental contamination detector 104 may include other circuitry depending on the particular implementation.

Shared environment 100 further comprises indicator light 112, service processor 114, and forwarding engine 116. Although depicted as part of the same shared environment 100 as environmental contamination detector 104, in other embodiments one or more of these components may be located remotely in a different environment. Additionally or alternatively, one or more of these components may be omitted from the system entirely.

In some embodiments, indicator light 112 is illuminated when environmental contamination is detected by environmental contamination detector 104. Indicator light 112 may be a light emitting diode (LED), incandescent, or any other type of bulb. The size, position and/or color of indicator light 112 may be selected to be readily noticeable by a system administrator. For example, indicator light 112 may be illuminated red (or some other noticeable color) and positioned on the front panel of a hardware rack to provide ample warning of environmental contamination.

Service processor 114 is a specialized processor that provides remote telemetry and management capabilities for hardware resource(s) 102. In some embodiments, service processor 114 monitors for alert signals output by environmental contamination detector 104. If an alert signal is detected, then service processor 114 may update status information associated with the hardware resource(s) 102 to indicate that these resources were likely exposed to environmental contamination. Service processor 114 may further allow for remote management capabilities, such as rebooting, reconfiguring, and migrating resources.

In some embodiments, service processor 114 executes a set of one or more programs that include service interface 118. Service interface 118 manages interactions between remote host(s) 120 and service processor 114. For example, service interface 118 may present current status information about hardware resource(s) 102 based on real-time monitoring of service processor 114. Additionally or alternatively, remote host(s) 120 may submit service requests to service processor 114, such as requests to reboot or reconfigure a resource, via service interface 118.

In some embodiments, service interface 118 renders user interface elements and receives input via user interface elements. Examples of interfaces include, but are not limited to, a graphical user interface (GUI), a command line interface (CLI), a web interface, a haptic interface, and a voice command interface. Examples of user interface elements include checkboxes, radio buttons, dropdown lists, list boxes, buttons, toggles, text fields, date and time selectors, command lines, sliders, pages, and forms.

Remote host(s) 120 may be any type of network host. Examples include, but are not limited to, desktop computers, mainframes, and mobile devices (e.g., tablets, laptops, phones, PDAs, etc.). In some embodiments remote hosts 120 execute a client application for communicating with service interface 118. For example, the client application may be a web browser that allows a user to access a web interface to remotely monitor and manage hardware resource(s) 102. In other embodiments, the client application may allow CLI commands to be submitted to service interface 118 using one or more communication protocols of the Internet Protocol (IP) suite.

Forwarding engine 116 may be configured to forward alerts generated by environmental contamination detector 104 to remote host(s) 120 or other external nodes. In some embodiments, a user may register network addresses, email addresses, social media handles and/or short message service (SMS) numbers with forwarding engine 116. When an alert is triggered, forwarding engine 116 may send an email, social media message, SMS, or other network message to immediately notify a user.

Although only a single environmental contamination detector 104, in other embodiments, multiple detectors may be distributed through shared environment 100. For example, a server rack may include a detector near the power supply, one near the bottom of the rack, and/or one near the top of the rack. This approach allows contaminants localized to a particular area within shared environment 100 to be more easily detected.

3. Predictive Alerting Circuitry and Methods

As previously noted, environmental contamination detector 104 may provide early warning of contaminants within shared environment 100. With early detection and alerting, significant and irreversible damage to hardware resource(s) 102 may be avoided. Preemptive actions may further be taken to prevent hardware and service outages.

Figure 2:
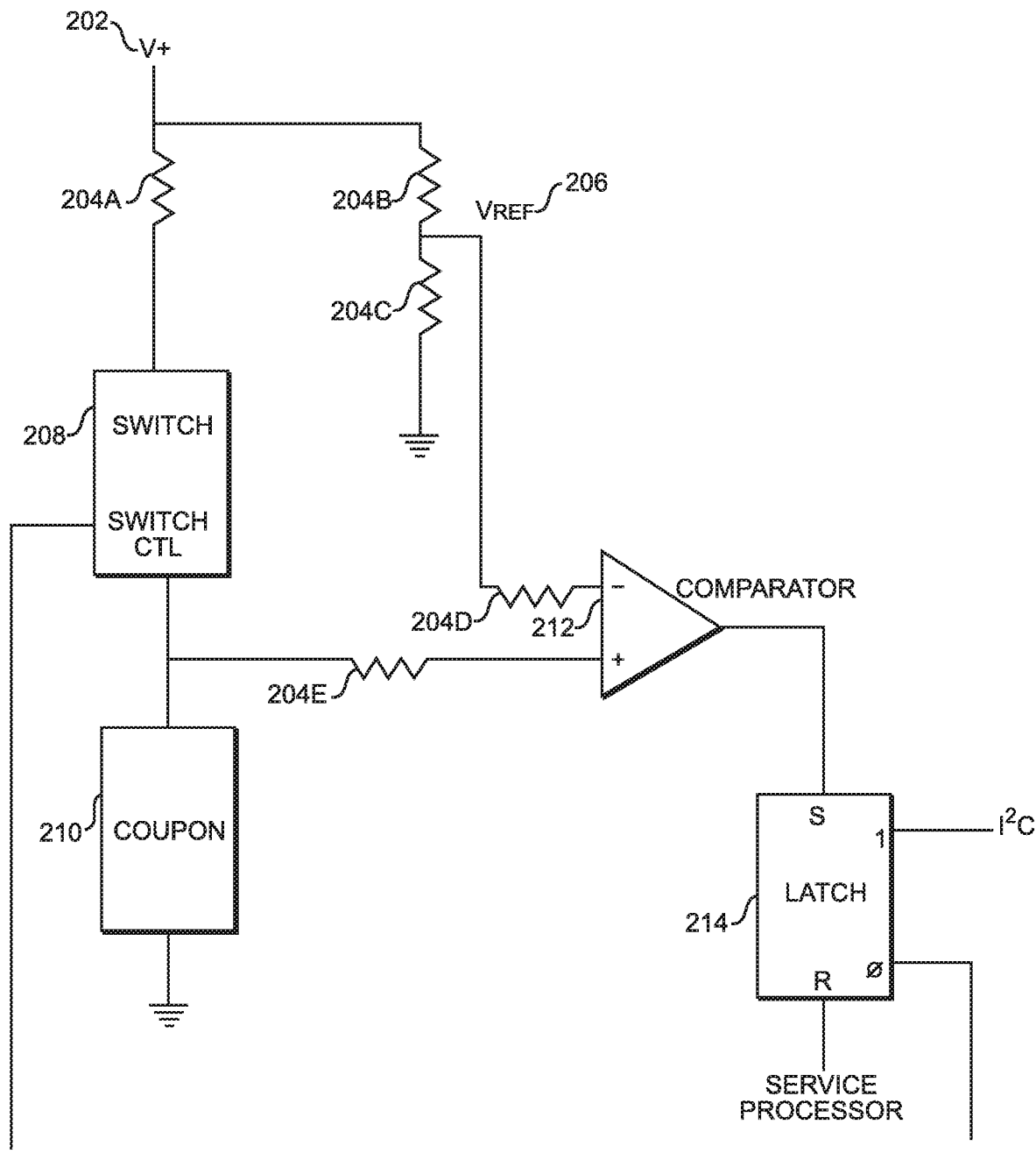
FIG. 2 illustrates an example circuit diagram for an environmental contamination detector in accordance with some embodiments.

FIG. 2 illustrates an example circuit diagram for environmental contamination detector 104 in accordance with some embodiments. The circuitry is provided for illustration only to facilitate understanding. However, it is noted that the exact circuitry, such as the configuration of the resistors, switches, and other electronic components may vary from implementation to implementation. Referring to FIG. 2, voltage source 202 is a bias circuit providing a substantially constant DC voltage. Voltage source 202 may include a step up converter, a step down converter, an AC-to-DC converter and/or other circuitry to supply the voltage bias.

Voltage source 202 is coupled to a first terminal of resistor 204a and resistor 204b. The second terminal of resistor 204a is coupled to a first terminal of switch 208. The second terminal of resistor 204b is coupled to a first terminal of resistor 204c and resistor 204d. The second terminal of resistor 204c is tied to ground, and the second terminal of resistor 204d is coupled to an input of comparator 212.

A second terminal of switch 208 is coupled to a first terminal of resistor 204e and test coupon 210. A switch control line is also coupled to switch 208 to control whether the voltage bias is applied to test coupon 210 or not. For example, the voltage bias may be cutoff near instantaneously when environmental contamination is detected. As explained further below, the switch control may be tied to an output terminal of latch 214 to control electronic instigation of test coupon 210.

Test coupon 210 includes a set of two or more conductive traces in parallel. In some embodiments, the conductive traces are copper traces that are narrowly and evenly spaced on a printed circuit board. The conductive traces are not connected to each other, but rather left open. A voltage bias instigates the formation of bridges between traces in the presence of contaminants. For example, a high enough voltage bias may instigate dendrite growth, also referred to as filaments, that bridge the copper traces. As previously indicated, the voltage bias may be different than the voltage bias applied to the systems being protected (e.g., hardware resource(s) 102) to accelerate dendrite formation in test coupon 210 relative to circuits within the systems being protected. Additionally or alternatively, the conductive traces in test coupon 210 may be designed to be narrower than the traces within the systems being protected to speed instigation of the formation of creep corrosion type phenomena in test coupon 210.

In some embodiments, the metallurgy and/or other chemical compositions within test coupon 210 may be designed to match the systems being protected. If hardware resources are deployed using new manufacturing processes, test coupon 210 may be updated to match the current manufacturing processes. For example, the spacing between the conductive traces may become narrower and/or the chemical composition of the nonconductive substrates of a printed circuit board may modified. As another example, chemical coatings applied to a printed circuit board may evolve over time.

Matching the manufacturing processes helps ensure that hardware resource(s) 102 are adequately protected. In other embodiments, the metallurgy and/or chemical composition of test coupon 210 may be designed differently than the systems being protected to induce dendrite formation. For instance, test coupon 210 may be designed using less protective coating and/or using materials more susceptible to dendrite formations.

Referring again to FIG. 2, the second terminal of resistor 204e is coupled to the other input line of comparator 212. Comparator 212 monitors and compares the reference voltage 206 with the voltage across test coupon 210. When the conductive traces in test coupon 210 are bridged, such as by dendrite formation, changes in the voltages being monitored may be detected by comparator 212. Thus, a dendrite bridge provides electrical evidence of the phenomenon taking place within shared environment 100.

The output of comparator 212 is coupled to the set input of S-R latch 214, which stores an indication of whether environmental contamination has been detected. For example, a high voltage level, or "1", may be used to indicate contamination was detected, and low voltage level, or "0", may indicate that no contamination was detected. Other implementations may use the inverse such that a "0" indicates detected contaminants and "1" indicates no detected contaminants.

The output of S-R latch 214 may be coupled via a serial interface, such as an I²C interface, to indicator light 112, service processor 114, forwarding engine 116, and/or other components. In a normal operating state, S-R latch 214 stores an indication of no detected contaminants. When comparator 212 detects voltage anomalies indicative of contamination, S-R latch 214 transitions to an alert state, which provides a notification via the serial interface that environmental contamination was detected.

In some embodiments, the output of S-R latch 214 is coupled to the switch control of switch 208. When S-R latch 214 transitions from the normal operating state to the alert state (e.g., transitions from "0" to "1"), the switch control turns off the voltage bias applied to test coupon 210. This helps preserve dendrite and other filament formations that have developed on test coupon 210, leaving chemical evidence of the environmental contamination.

In some embodiments, service processor 114 is connected to the reset line of S-R latch 214. Service processor 114 may be used to restore S-R latch 214 to its normal operating state in the event of a false alarm or if the problem has been addressed.

Figure 3:
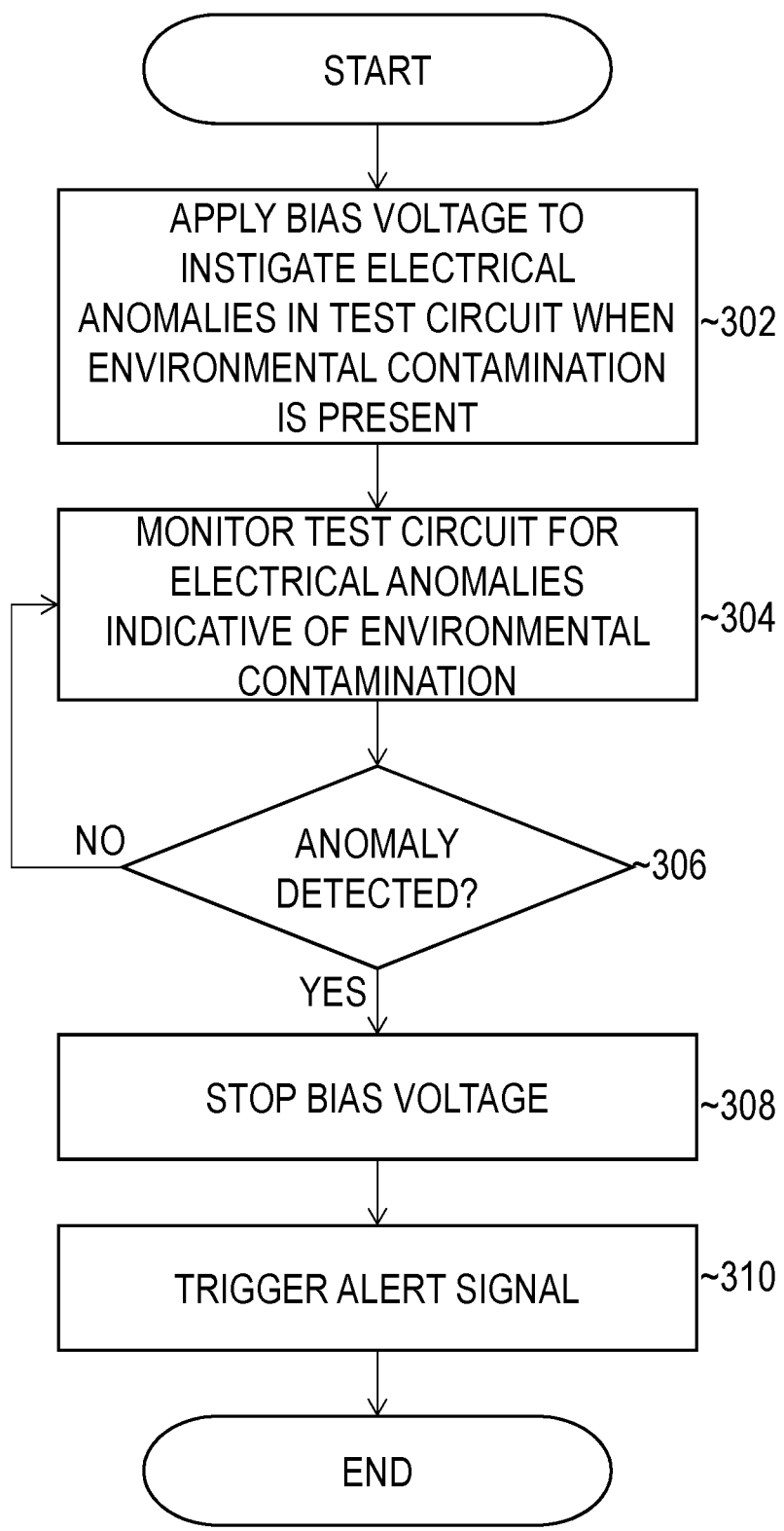
FIG. 3 illustrates an example set of operations for generating predictive alerts to warn of potentially harmful environmental contamination in accordance with some embodiments.

FIG. 3 illustrates an example set of operations for generating predictive alerts to warn of potentially harmful environmental contamination in accordance with some embodiments. One or more operations illustrated in FIG. 3 may be modified, rearranged, or omitted all together. Accordingly, the particular sequence of operations illustrated in FIG. 3 should not be construed as limiting the scope of one or more embodiments.

Referring to FIG. 3, the set of operations includes applying a bias voltage to instigate electrical anomalies in test circuit 108 when environmental contamination is present (operation 302). The bias voltage that is applied may vary depending on the particular implementation. In some embodiments, the bias voltage is selected to be higher than the bias/operating voltage of hardware resource(s) 102. For example, if the operating voltage is +5 Volts (V), then a bias voltage of +10V or +12V may be applied. In hardware where the operating voltage is +3.5V, then a bias voltage of +5V or +7.5V may suffice. A higher bias voltage induces dendrite growth more quickly in test circuit 108 than hardware resource(s) 102, which may be advantageous since test circuit 108 is less expensive to replace than expensive hardware resource(s) 102 and would not cause service outages upon failure. It is noted that a bias voltage that is significantly higher may induce false positives alerts and/or consume more power than needed. Therefore, the bias voltage may be tuned with these competing interests in mind and may vary from one implementation to the next. Additionally or alternatively, as previously mentioned, the conductive traces in test coupon may be designed to be narrower than the systems being protected to help accelerate dendrite formations.

While the bias voltage is being applied, the process includes monitoring test circuit 108 for electrical anomalies indicative of environmental contamination (operation 304). For example, as previously mentioned, comparator 212 may compare the voltage across the traces in test coupon 210 with reference voltage 206 to detect voltage changes indicative of contamination. Additionally or alternatively, the process may monitor for other electrical anomalies such as changes in current loads. In normal operating mode, the traces are open experiencing little or no current load. When two traces have been bridged, such as by dendrite formation or exposure to water molecules, then current may begin flowing through the traces. Thus, the process may monitor for sudden changes in current flows to detect electrical anomalies indicative of contamination.

The process continues monitoring until an electrical anomaly indicative of contamination has been detected (operation 306). For example, the process may continue monitoring until a current flow in test coupon 210 is detected.

Responsive to detecting an electrical anomaly, the process stops the bias voltage (operation 308). As previously indicated, stopping the bias voltage may help preserve evidence of contaminants, such as dendrite and metal filaments. The evidence may be useful in post-mortem analytics to identify the root cause of contamination within shared environment 100.

The process further triggers an alert signal responsive to detecting the electrical anomaly (operation 310). In some embodiments, the alert signal is output to indicator light 112 and causes indicator light 112 to be illuminated. Additionally or alternatively, the alert signal may be provided as an interrupt to service processor 114 or service processor 114 may periodically check the status of S-R latch 214. Additionally or alternatively, the alert signal may be transmitted, such as via a registered email, social media account, or SMS number, to notify a user. The user may thus be alerted in real-time that hardware resource(s) 102 were likely exposed to environmental contamination and take appropriate preventative action to avoid outages and hardware failure.

4. Test Circuit Configurations and Analytics

Environmental contamination detector 104 may detect contaminants from a variety of sources. For example, environmental contamination detector 104 may detect corrosion caused by high levels of humidity within shared environment 100. As another example, environmental contamination detector 104 may detect sulfuric gases, such as hydrogen sulfide or sulfur dioxide, which may be emitted by batteries, unsealed concrete subfloors, or other sources. In yet another example, environmental contamination detector 104 may detect metal shavings, such as zinc whiskers, which may be introduced from older perforated floor tiles or nearby pipes.

Figure 4:
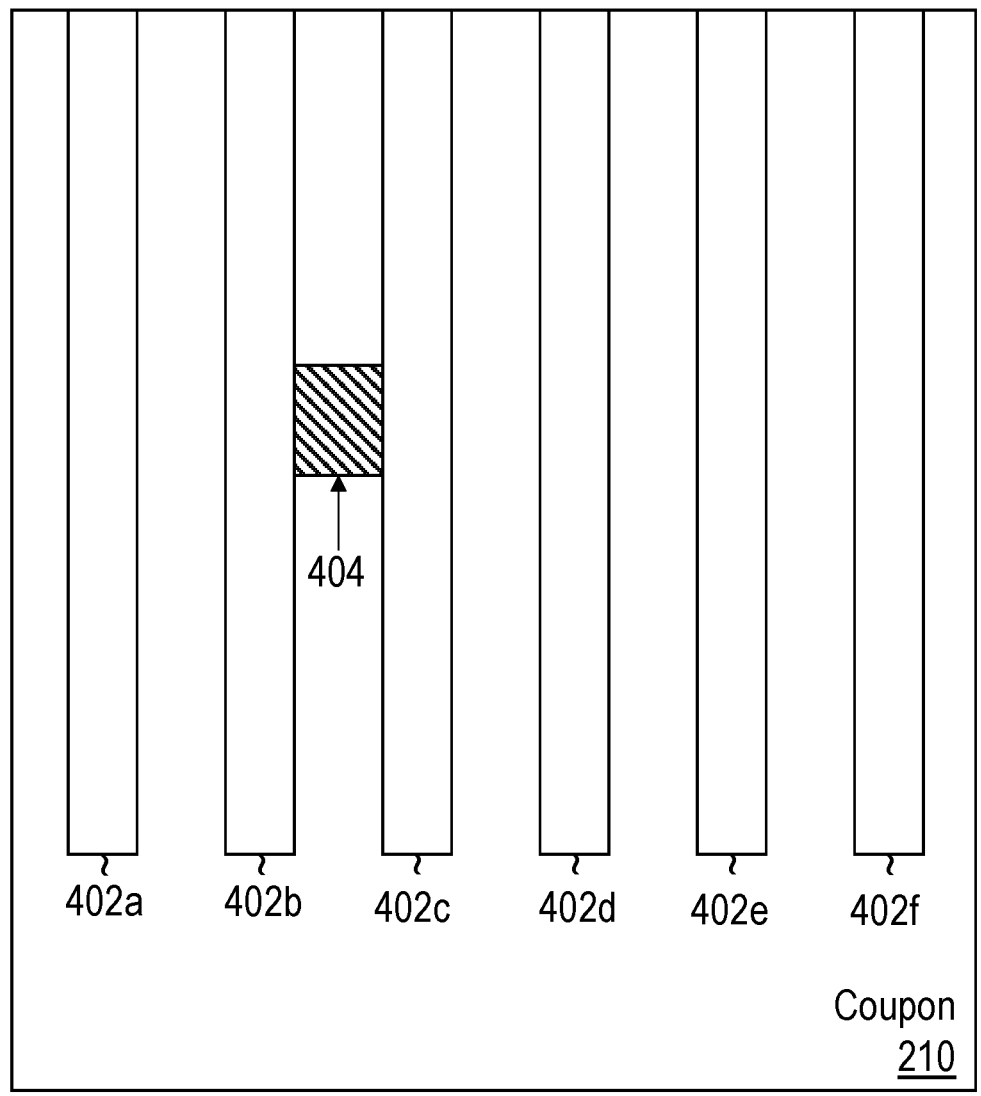
FIG. 4 illustrates an example test coupon where a bridge between two conductive traces has formed in accordance with some embodiments.

Any of the above examples of contaminants may cause bridges to form between traces in test coupon 210. FIG. 4 illustrates an example test coupon where a bridge between two conductive traces has formed in accordance with some embodiments. Test coupon 210 includes copper traces 402a-f on a printed circuit board. The spacing between the circuits prevents current from flowing within test coupon 210. However, bridge 404 is a filament that creates an electrical connection between copper traces 402b and 402c. Bridge 404 causes current to flow between the two copper traces, with one acting as an anode and the other as a cathode. Bridge 404 may correspond to a dendrite formation, a metal shaving, or any other chemical compound that bridges the non-conductive spacing between the copper traces. As indicated above, the spacing between the copper traces on test coupon 210 may be smaller than spacing between traces in the systems being protected. For instance, the nonconductive substrate of the printed circuit board between copper traces 402b and 402c may be narrower than the spacing between any of the copper traces in hardware resource(s) 102.

Although six traces are depicted in FIG. 4, the number of traces on test coupon 210 may vary from implementation to implementation. It was found that a printed circuit board with a surface area of approximately 1 to 2 square inches with closely spaced parallel copper traces (0.1 to 1 millimeter apart) was effective at detecting creep corrosion and similar phenomena. This configuration provides sufficient exposure to capture contaminants in typical airflows of computing systems without consuming a significant amount of real estate. However, the size, trace spacing and/or number of traces may vary depending on the particular application.

In some embodiments, test coupon 210 is removable to allow for post-mortem analytics when contamination is detected. For example, test coupon 210 may be subject to microscopic, photographic and/or chemical examination. A microscopic and/or chemical analysis may determine the chemical composition of bridge 404, to help isolate the root cause of contamination. Metallurgical diagnostics may be executed to identify the types of metals within a dendrite formation. Further, the shape of the dendrite formations may also be indicative of the source of corrosion. As previously noted, this evidence may be preserved by near-instantaneously stopping the bias voltage when electrical anomalies are detected to prevent a high current load from destroying bridge 404.

Figure 5:
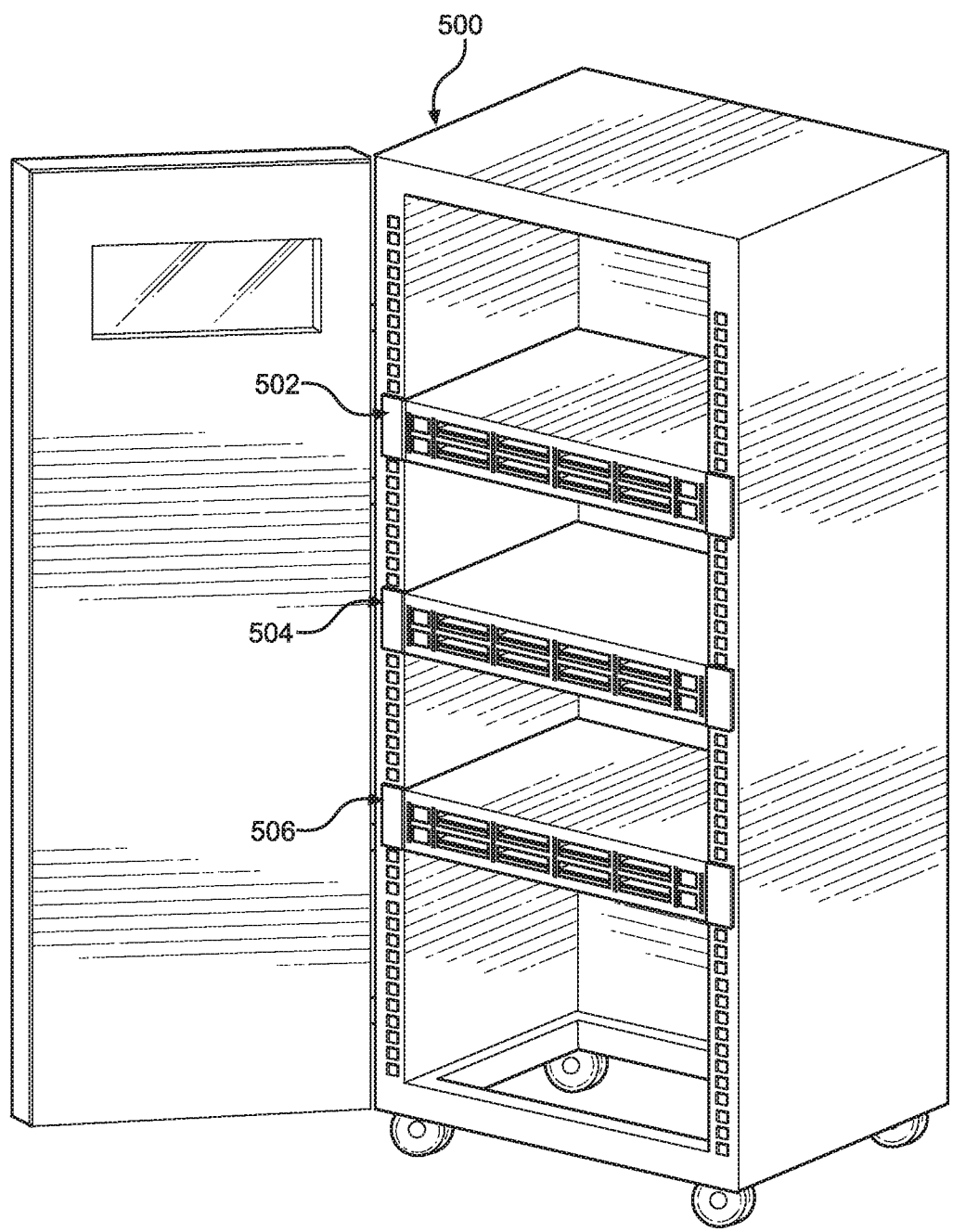
FIG. 5 illustrates an example rack system with an environmental contamination module in accordance with some embodiments.

In some embodiments, test coupon 210 is included in a rack-mounted hardware module. Test coupon 210 may be added or otherwise integrated into another module, such as a server rack module. Alternatively, test coupon 210 may be integrated into a stand-alone rack-mounted module. For example, FIG. 5 illustrates an example rack system with an environmental contamination module in accordance with some embodiments. Hardware rack system 500 includes rack-mounted modules 502, 504, and 506. One or more of these rack-mounted modules may include the environmental contamination detection circuitry previously described. It is also noted that the size and shape of the modules and the hardware rack may vary from implementation to implementation.

In some embodiments, indicator light 112 may be positioned on the front panel of hardware rack 500. Hardware rack system 500 may provide a serial link between one or more of rack-mounted modules to illuminate the light in the event that contaminates are detected. The test circuitry helps protect other expensive rack hardware from incurring irreversible damage. Further, the test circuit itself is easily removable for post-mortem analytics and replaceable for future monitoring.

5. Remote Telemetry Interfaces and Methods

In some embodiments, service processor 114 is configured to monitor the status of hardware resource(s) 102. For example, service processor 114 may monitor a set of sensors that track the physical state of a server and/or other hardware component. The set of sensors may include environmental contamination detector 104, which service processor 114 may monitor for alerts. Other sensors may also be monitored, such as temperature, voltage, fan speed, and performance sensors. Additionally or alternatively, service processor 114 may collect other status information such as event logs, server fault information, and/or other performance attributes. Service processor 114 may aggregate and present the information in a manner that provides a comprehensive overview of the health of hardware resource(s) 102.

Figure 6:
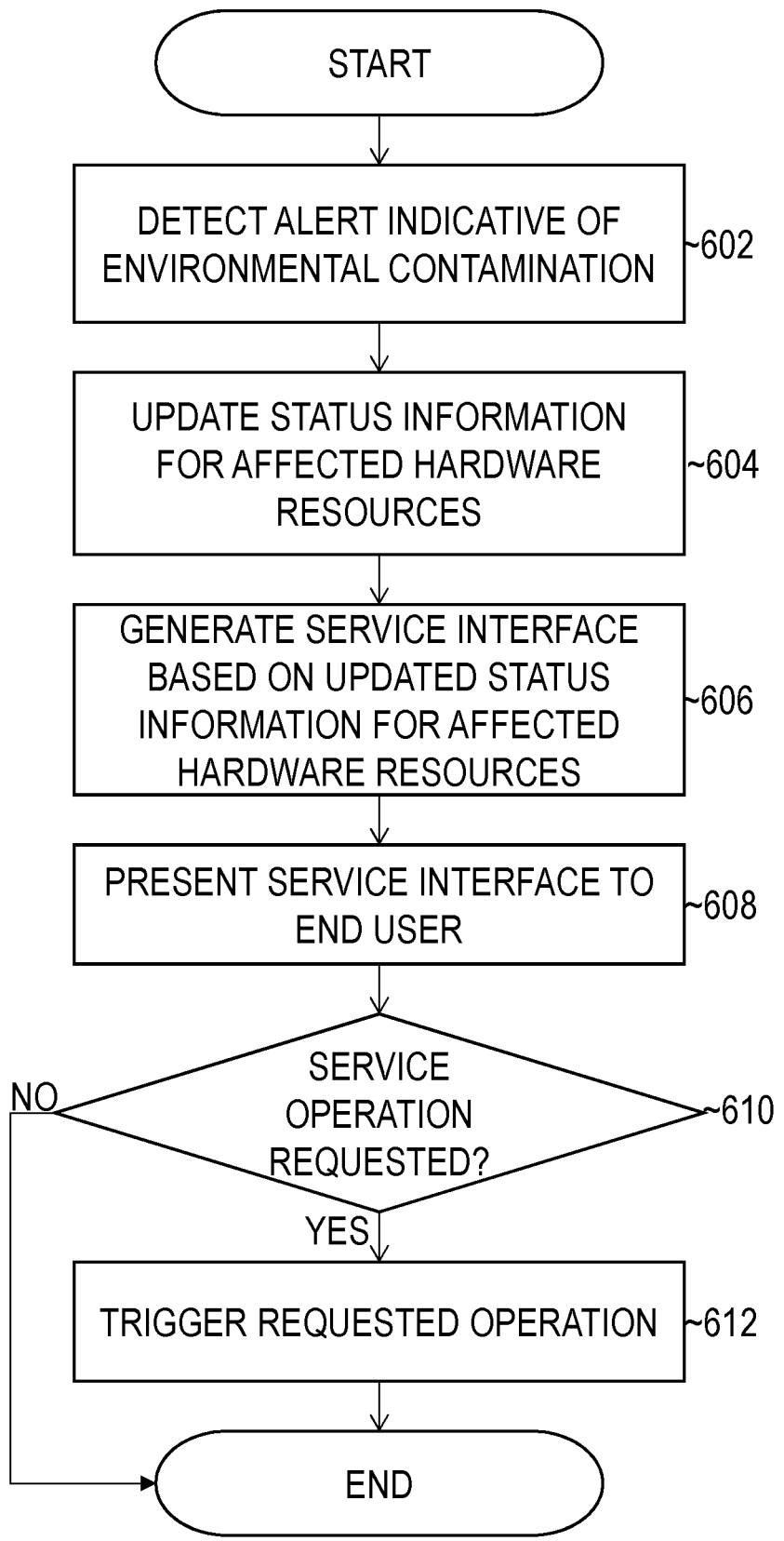
FIG. 6 illustrates an example set of operations for providing telemetry to facilitate resource management in accordance with some embodiments.

FIG. 6 illustrates an example set of operations for providing remote telemetry to facilitate resource management in accordance with some embodiments. One or more operations illustrated in FIG. 6 may be modified, rearranged, or omitted all together. Accordingly, the particular sequence of operations illustrated in FIG. 6 should not be construed as limiting the scope of one or more embodiments.

Referring to FIG. 6, the process includes detecting an alert indicative of environmental contamination (operation 602). For example, service processor 114 may monitor S-R latch 214 to detect transitions from the normal state to the alert state.

Responsive to detecting an alert, service processor 114 updates a set of status information for the affected hardware resources (operation 604). An affected hardware resource in this context may be any hardware resource in shared environment 100 that is potentially exposed to the environmental contamination. The status information may capture various attributes, such as the time the contamination was first detected, hostnames of the affected hardware resources, and the location of the shared environment. Additionally or alternatively, the status information may present information about likely causes of the contamination. The predictions may be made based on the type of electrical anomaly detected by environmental contamination detector 104. For example, a consistent 20 megaohm short is indicative that moisture is forming. On the other hand, if a very high amount of current is drawn instantly, it may be indicative of a zinc whisker or other metal breaching the traces. Further microscopic or chemical analysis, such as previously described, may be warranted to confirm the cause of the alert.

The process includes generating or updating a service interface based on the updated status information for the affected resources (operation 606). In some embodiments, the service interface is a web interface, such as a webpage or series of webpages. For example, one or more GUI elements in the web interface may be updated to identify information about the hardware resources that were potentially exposed to contaminants. Additionally or alternatively, service processor 114 may generate CLIs and/or any of the other interfaces previously described to present the status information. The interface may be generated to draw attention to the alert. For example, a GUI element may be presented in a noticeable color, enlarged, and/or otherwise highlighted to provide ample warning.

The process further includes presenting the service interface to an end user (operation 608). For example, the service interface may be accessible via a web application, such as a browser or a mobile app. The webpage may be secured preventing unauthenticated clients/users from accessing the status information.

FIG. 7 illustrates an example graphical user interface (GUI) 700 for viewing and managing hardware resources in accordance with some embodiments. GUI 700 may correspond to a webpage and includes navigation pane 702, general information 704, action panel 706, and status information 708. Navigation pane 702 allows a user to drill down on various hardware system information. For example, the user may view status information on processors, memory, power, cooling, storage, networking, contaminant monitors, PCI Devices, and firmware. Further, navigation pane 702 allows a user to navigate to and view available system, host, and power management operations.

General information 704 provides a broad overview of system attributes. In the present example, the system is a rack mounted server. Various other attributes, such as firmware version and network addresses are also listed here. Actions pane 706 allows the user to remotely execute various actions on the server module including turning off the module, turning on a locator indicator, updating the firmware, and launching a remote console.

Status information 708 provides a snapshot of the overall health of the server module. In the present example, all subsystems are in normal operating state with the exception of the contaminant monitor, where an alert indicates that a contaminant was detected. The alert is added to the total problem count. Here, the total problem count is only 1. However, it is possible that the contamination may have affected other subsystems, such as one or more of the four installed processors, the memory subsystem, etc. In this scenario, each identified problem may be summed together to obtain the total problem count.

Referring again to FIG. 6, the process includes determining whether a service operation is requested (operation 610). For example, a user may click on or otherwise select an action from actions pane 706 of GUI 700. Alternatively, the user may navigate to other available actions through navigation pane 702.

If requested, then the service operation is executed by service processor 114 (operation 612). For example, service processor 114 may shut down a hardware resource, launch a remote console, adjust basic input/output settings (BIOS), or otherwise reconfigure hardware. Early alerting and remote management capabilities allow system administrators to take prompt action to prevent hardware outages in the event of a caustic environment. For example, a system administrator may bring backup servers online, reconfigure load balancers, migrate data, and/or take other preemptive actions.

6. Computing Hardware Architecture

In some embodiments, one or more of the techniques described herein may be implemented by one or more special-purpose computing devices. The special-purpose computing devices may be hard-wired to perform the techniques, or may include digital electronic devices such as one or more application-specific integrated circuits (ASICs), field programmable gate arrays (FPGAs), or network processing units (NPUs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, FPGAs, or NPUs with custom programming to accomplish the techniques. The special-purpose computing devices may be desktop computer systems, portable computer systems, handheld devices, networking devices or any other device that incorporates hard-wired and/or program logic to implement the techniques.

Figure 8:
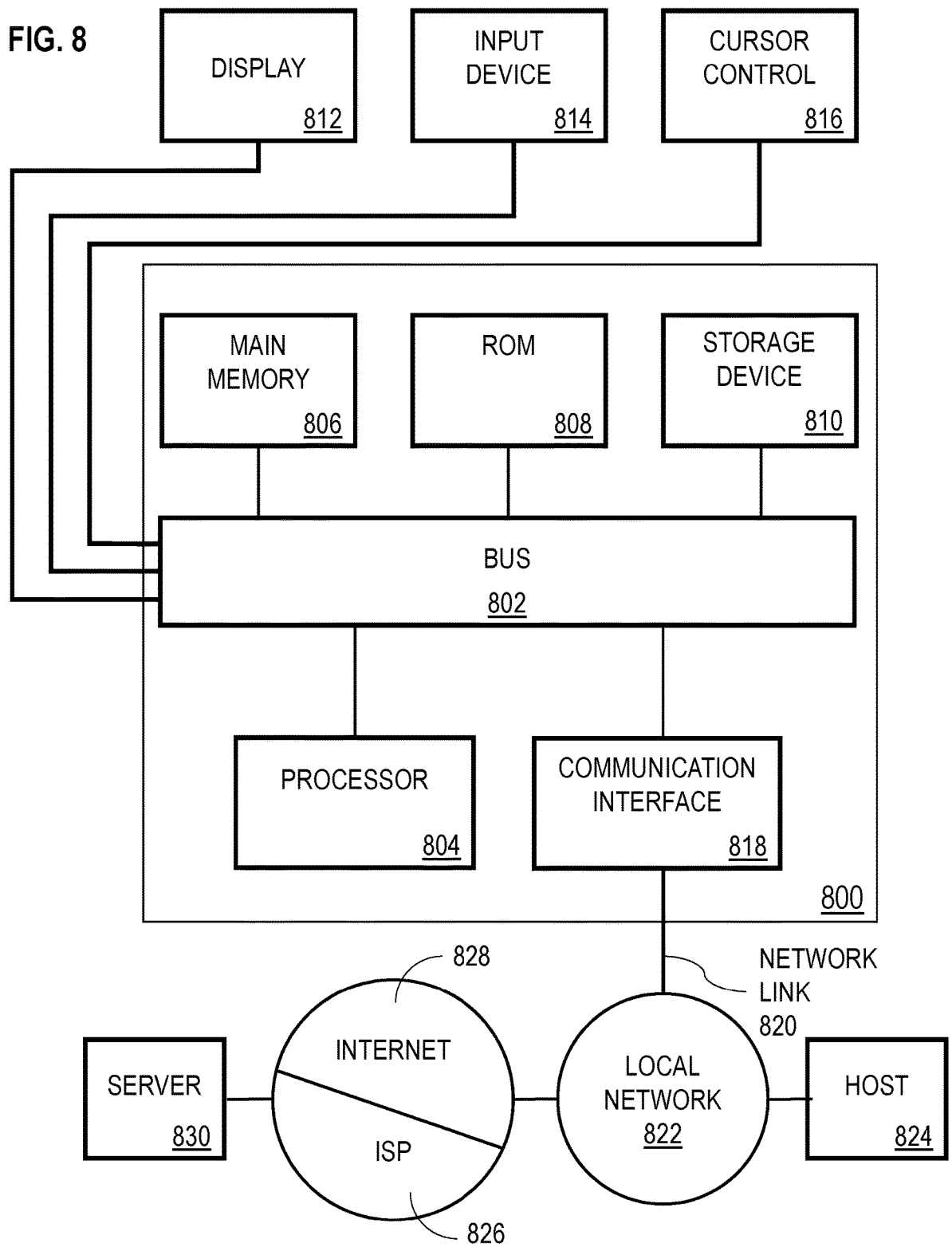
FIG. 8 illustrates a block diagram that depicts an example computer system in accordance with some embodiments.

For example, FIG. 8 is a block diagram that illustrates computer system 800 upon which an embodiment of the invention may be implemented. Computer system 800 includes bus 802 or other communication mechanism for communicating information, and a hardware processor 804 coupled with bus 802 for processing information. Hardware processor 804 may be, for example, a general purpose microprocessor.

Computer system 800 also includes main memory 806, such as a random access memory (RAM) or other dynamic storage device, coupled to bus 802 for storing information and instructions to be executed by processor 804. Main memory 806 also may be used for storing temporary variables or other intermediate information during execution of instructions to be executed by processor 804. Such instructions, when stored in non-transitory storage media accessible to processor 804, render computer system 800 into a special-purpose machine that is customized to perform the operations specified in the instructions.

Computer system 800 further includes read only memory (ROM) 808 or other static storage device coupled to bus 802 for storing static information and instructions for processor 804. Storage device 810, such as a magnetic disk or optical disk, is provided and coupled to bus 802 for storing information and instructions.

Computer system 800 may be coupled via bus 802 to display 812, such as a cathode ray tube (CRT) or light emitting diode (LED) monitor, for displaying information to a computer user. Input device 814, which may include alphanumeric and other keys, is coupled to bus 802 for communicating information and command selections to processor 804. Another type of user input device is cursor control 816, such as a mouse, a trackball, touchscreen, or cursor direction keys for communicating direction information and command selections to processor 804 and for controlling cursor movement on display 812. Input device 814 typically has two degrees of freedom in two axes, a first axis (e.g., x) and a second axis (e.g., y), that allows the device to specify positions in a plane.

Computer system 800 may implement the techniques described herein using customized hard-wired logic, one or more ASICs or FPGAs, firmware and/or program logic which in combination with the computer system causes or programs computer system 800 to be a special-purpose machine. According to one embodiment, the techniques herein are performed by computer system 800 in response to processor 804 executing one or more sequences of one or more instructions contained in main memory 806. Such instructions may be read into main memory 806 from another storage medium, such as storage device 810. Execution of the sequences of instructions contained in main memory 806 causes processor 804 to perform the process steps described herein. In alternative embodiments, hard-wired circuitry may be used in place of or in combination with software instructions.

The term "storage media" as used herein refers to any non-transitory media that store data and/or instructions that cause a machine to operate in a specific fashion. Such storage media may comprise non-volatile media and/or volatile media. Non-volatile media includes, for example, optical or magnetic disks, such as storage device 810. Volatile media includes dynamic memory, such as main memory 806. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, content-addressable memory (CAM), and ternary content-addressable memory (TCAM).

Storage media is distinct from but may be used in conjunction with transmission media. Transmission media participates in transferring information between storage media. For example, transmission media includes coaxial cables, copper wire and fiber optics, including the wires that comprise bus 802. Transmission media can also take the form of acoustic or light waves, such as those generated during radio-wave and infra-red data communications.

Various forms of media may be involved in carrying one or more sequences of one or more instructions to processor 804 for execution. For example, the instructions may initially be carried on a magnetic disk or solid state drive of a remote computer. The remote computer can load the instructions into its dynamic memory and send the instructions over a network line, such as a telephone line, a fiber optic cable, or a coaxial cable, using a modem. A modem local to computer system 800 can receive the data on the network line and use an infra-red transmitter to convert the data to an infra-red signal. An infra-red detector can receive the data carried in the infra-red signal and appropriate circuitry can place the data on bus 802. Bus 802 carries the data to main memory 806, from which processor 804 retrieves and executes the instructions. The instructions received by main memory 806 may optionally be stored on storage device 810 either before or after execution by processor 804.

Computer system 800 also includes a communication interface 818 coupled to bus 802. Communication interface 818 provides a two-way data communication coupling to a network link 820 that is connected to a local network 822. For example, communication interface 818 may be an integrated services digital network (ISDN) card, cable modem, satellite modem, or a modem to provide a data communication connection to a corresponding type of telephone line. As another example, communication interface 818 may be a local area network (LAN) card to provide a data communication connection to a compatible LAN. Wireless links may also be implemented. In any such implementation, communication interface 818 sends and receives electrical, electromagnetic or optical signals that carry digital data streams representing various types of information.

Network link 820 typically provides data communication through one or more networks to other data devices. For example, network link 820 may provide a connection through local network 822 to a host computer 824 or to data equipment operated by an Internet Service Provider (ISP) 826. ISP 826 in turn provides data communication services through the world wide packet data communication network now commonly referred to as the "Internet" 828. Local network 822 and Internet 828 both use electrical, electromagnetic or optical signals that carry digital data streams. The signals through the various networks and the signals on network link 820 and through communication interface 818, which carry the digital data to and from computer system 800, are example forms of transmission media.

Computer system 800 can send messages and receive data, including program code, through the network(s), network link 820 and communication interface 818. In the Internet example, a server 830 might transmit a requested code for an application program through Internet 828, ISP 826, local network 822 and communication interface 818.

The received code may be executed by processor 804 as it is received, and/or stored in storage device 810, or other non-volatile storage for later execution.

7. Miscellaneous; Extensions

Embodiments are directed to a system with one or more devices that include a hardware processor and that are configured to perform any of the operations described herein and/or recited in any of the claims below.

In an embodiment, a non-transitory computer readable storage medium comprises instructions which, when executed by one or more hardware processors, causes performance of any of the operations described herein and/or recited in any of the claims.

Any combination of the features and functionalities described herein may be used in accordance with one or more embodiments. In the foregoing specification, embodiments have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

What is claimed is:

1. A method comprising:
applying a bias voltage to a set of two or more conductive traces of a first circuit at a level that instigates one or more electrical anomalies between different traces in the set of two or more conductive traces when environmental contamination is present, wherein the bias voltage induces electrical bridge formation more quickly between the set of two or more conductive traces than traces in a second circuit in a same environment when the environmental contamination is present, wherein a second bias voltage is applied to the second circuit, wherein the bias voltage applied to the set of two or more conductive traces is different than the second bias voltage to instigate the one or more electrical anomalies in the set of two or more conductive traces before the environmental contamination causes the one or more electrical anomalies in the second circuit where the second bias voltage is applied;
monitoring the first circuit for the one or more electrical anomalies between different traces in the set of two or more conductive traces;
responsive to detecting, in the first circuit, the one or more electrical anomalies between different traces in the set of two or more conductive traces, generating an alert that indicates that the second circuit has likely been exposed to the environmental contamination.

2. The method of claim 1, wherein the alert is generated before the environmental contamination causes the one or more electrical anomalies in the second circuit, wherein the alert is predictive that the one or more electrical anomalies will occur in the second circuit if the environmental contamination is not addressed.

3. The method of claim 1, wherein monitoring the first circuit for the one or more electrical anomalies comprises monitoring the set of two or more conductive traces for a current load or voltage change indicative that the environmental contamination has caused a breach between at least two traces in the first circuit.

4. The method of claim 1, further comprising: responsive to detecting, in the first circuit, the one or more electrical anomalies indicative of the environmental contamination, stopping electrical instigation of the first circuit to preserve evidence of the environmental contamination in the first circuit.

5. The method of claim 4, further comprising performing an analysis of the first circuit to determine a cause of the environmental contamination based on the evidence preserved through stopping the electrical instigation of the first circuit.

6. The method of claim 1, further comprising sending the alert to a service processor, wherein the service processor updates status information for at least one hardware device based on the alert.

7. The method of claim 6, wherein the status information for the at least one hardware device is accessible by one or more remote network hosts.

8. The method of claim 1, further comprising updating a user interface for managing a set of hardware resources, wherein the updated user interface identifies a subset of one or more hardware resources in the set of hardware resources that have likely been exposed to the environmental contamination.

9. The method of claim 1, further comprising: responsive to detecting, in the first circuit, the one or more electrical anomalies indicative of the environmental contamination, switching on an indicator light that warns of the environmental contamination.

10. The method of claim 1, wherein the first circuit is one of an embedded module that is a subcomponent of the second circuit or a rack module that is mounted to a particular hardware rack to which a separate rack module including the second circuit is mounted.

11. A system for environmental contamination monitoring comprising:
a first circuit including a set of two or more conductive traces separated by a nonconductive substrate;
a bias circuit for applying a bias voltage to the set of two or more conductive traces at a level that instigates one or more electrical anomalies between different traces in the set of two or more conductive traces when the environmental contamination is present, wherein the bias voltage induces electrical bridge formation more quickly between the set of two or more conductive traces than traces in a second circuit in a same environment when the environmental contamination is present, wherein a second bias voltage is applied to the second circuit, wherein the bias voltage applied to the set of two or more conductive traces is different than the second bias voltage to instigate the one or more electrical anomalies in the set of two or more conductive traces before the environmental contamination causes the one or more electrical anomalies in the second circuit where the second bias voltage is applied;
a monitoring circuit electrically coupled to the set of two or more conductive traces, wherein the monitoring circuit generates an alarm responsive to detecting the one or more electrical anomalies between different traces in the set of two or more conductive traces.

12. The system of claim 11, wherein the monitoring circuit comprises a comparator that compares a voltage across the set of two or more conductive traces to a reference voltage to determine whether the voltage across the set of two or more conductive traces has changed in a manner indicative that the nonconductive substrate between the different traces in the set of two or more traces has been breached.

13. The system of claim 11, wherein the bias circuit stops applying the bias voltage responsive to detecting the one or more electrical anomalies between different traces in the set of two or more conductive traces.

14. The system of claim 11, further comprising an indicator light coupled to the monitoring circuit, wherein the alarm causes the indicator light to be illuminated.

15. The system of claim 11, further comprising a service processor coupled to the monitoring circuit, wherein the service processor updates status information for a hardware resource based on the alarm to indicate that the hardware resource was likely exposed to the environmental contamination.

16. The system of claim 11, wherein the set of two or more traces are part of a printed circuit board that has a surface area of between one and two square inches.

17. The system of claim 16, wherein the printed circuit board is removable without affecting operation of other circuits exposed to the environmental contamination.

18. An apparatus for environmental contamination monitoring comprising:
means for applying a bias voltage to a set of two or more conductive traces of a first circuit at a level that instigates one or more electrical anomalies between different traces in the set of two or more conductive traces when environmental contamination is present, wherein the bias voltage induces electrical bridge formation more quickly between the set of two or more conductive traces than traces in a second circuit in a same environment when the environmental contamination is present, wherein a second bias voltage is applied to the second circuit, wherein the bias voltage applied to the set of two or more conductive traces is different than the second bias voltage to instigate the one or more electrical anomalies in the set of two or more conductive traces before the environmental contamination causes the one or more electrical anomalies in the second circuit where the second bias voltage is applied;
means for monitoring the first circuit for the one or more electrical anomalies between different traces in the set of two or more conductive traces;
means for generating an alert that indicates that the second circuit has likely been exposed to the environmental contamination responsive to detecting, in the first circuit, the one or more electrical anomalies.

19. The apparatus of claim 18, further comprising: means for stopping electrical instigation of the first circuit to preserve evidence of the environmental contamination in the first circuit responsive to detecting, in the first circuit, the one or more electrical anomalies.

20. The apparatus of claim 18, further comprising: means for sending the alert to a service processor, wherein the service processor updates status information for at least one hardware device based on the alert.

* * * * *